US008288786B2

(12) United States Patent
Hwang et al.

(10) Patent No.: US 8,288,786 B2
(45) Date of Patent: Oct. 16, 2012

(54) LIGHT EMITTING DEVICE AND METHOD FOR MANUFACTURING THE SAME

(75) Inventors: Sung Min Hwang, Anyang-si (KR); Hyun Kyong Cho, Seoul (KR); Gyeong Geun Park, Gwacheon-si (KR)

(73) Assignee: LG Innotek Co., Ltd., Seoul (KR)

( * ) Notice: Subject to any disclaimer, the term of this patent is extended or adjusted under 35 U.S.C. 154(b) by 407 days.

(21) Appl. No.: 12/614,240

(22) Filed: Nov. 6, 2009

(65) Prior Publication Data

US 2010/0127303 A1 May 27, 2010

(30) Foreign Application Priority Data

Nov. 24, 2008 (KR) ........................ 10-2008-0116751

(51) Int. Cl.
*H01L 33/00* (2010.01)
*H01L 21/00* (2006.01)

(52) U.S. Cl. ........... 257/98; 257/E33.001; 257/E33.005; 257/E33.062; 257/E33.065; 257/E33.067; 438/29

(58) Field of Classification Search .................... 257/98, 257/E33.001, E33.005, E33.007, E33.062, 257/E33.065, E33.067; 438/29
See application file for complete search history.

(56) References Cited

U.S. PATENT DOCUMENTS 5,565,694 A * 10/1996 Huang et al. .................... 257/97
6,225,648 B1 5/2001 Hsieh et al.
6,242,761 B1 * 6/2001 Fujimoto et al. ................ 257/94
6,492,661 B1 12/2002 Chien et al.
6,784,462 B2 * 8/2004 Schubert ......................... 257/98
7,015,513 B2 * 3/2006 Hsieh .............................. 257/99
2001/0011730 A1 8/2001 Saeki
2001/0050530 A1 * 12/2001 Murakami et al. ............ 313/498
2005/0167659 A1 * 8/2005 Hsieh et al. ..................... 257/40
2006/0163588 A1 7/2006 Udagawa
2007/0145391 A1 * 6/2007 Baik et al. ....................... 257/94
2008/0111139 A1 5/2008 Chae et al.
2008/0217635 A1 9/2008 Emerson et al.
2009/0039367 A1 * 2/2009 Iso et al. ......................... 257/98
2009/0242929 A1 * 10/2009 Lin .............................. 257/103
2009/0273003 A1 * 11/2009 Park ............................... 257/99
2010/0019268 A1 * 1/2010 Illek ............................... 257/99

FOREIGN PATENT DOCUMENTS

DE 199 37 524 A1 3/2001
JP 2003-46119 A 2/2003
JP 2004-47760 A 2/2004
KR 1994-0003109 B1 4/1994
KR 100673640 B1 1/2007

(Continued)

*Primary Examiner* — Cheung Lee
*Assistant Examiner* — Jeremy Joy
(74) *Attorney, Agent, or Firm* — Birch, Stewart, Kolasch & Birch, LLP

(57) ABSTRACT

A light emitting device according to an embodiment includes a second electrode layer comprising at least one projection part; at least one current blocking layer on the projection part of the second electrode layer; a second conductive type semiconductor layer on the second electrode layer and the current blocking layer; an active layer on the second conductive type semiconductor layer; a first conductive type semiconductor layer on the active layer; and a first electrode layer on the first conductive type semiconductor layer, at least a portion of the first electrode layer corresponding with the current blocking layer in a vertical direction.

21 Claims, 8 Drawing Sheets

100
30
40
50
90
91
70

FOREIGN PATENT DOCUMENTS

| | | | | |
|---|---|---|---|---|
| KR | 1020070082278 | A | | 8/2007 |
| KR | 10-2008-0018084 | A | | 2/2008 |
| KR | 10-2008-0043649 | A | | 5/2008 |
| WO | WO 2007/124708 | A1 | | 11/2007 |
| WO | WO 2007124708 | A1 | * | 11/2007 |

* cited by examiner

LIGHT EMITTING DEVICE AND METHOD FOR MANUFACTURING THE SAME

CROSS-REFERENCE TO RELATED APPLICATIONS

The present application claims priority under 35 U.S.C. 119 and 35 U.S.C. 365 to Korean Patent Application No. 10-2008-0116751 filed on Nov. 24, 2008, which is hereby incorporated by reference in its entirety.

BACKGROUND OF THE INVENTION

Embodiments relate to a light emitting device and a method for manufacturing the same.

Recently, an apparatus using a light emitting diode (LED) has been widely studied as a light emitting device.

The LED is an apparatus to convert electrical signals to light using characteristics of a semiconductor, wherein a first conductive type semiconductor layer, an active layer, and a second conductive type semiconductor are stacked and then power is applied to the stacked structure so that light is emitted from the active layer. The first conductive type semiconductor layer may be an n-type semiconductor layer and the second conductive type semiconductor layer may be a p-type semiconductor layer. Alternatively, the first conductive type semiconductor layer may be a p-type semiconductor layer and the second conductive type semiconductor layer may be an n-type semiconductor layer.

Meanwhile, in a vertical LED structure where a first electrode layer applying power to the first conductive type semiconductor and a second electrode layer applying power to the second conductive type semiconductor layer are overlapped in a vertical direction, a phenomenon where the electric current is concentrated on the bottom or lower side of the first electrode layer may occur.

When this phenomenon occurs, the operating voltage of the light emitting device is raised, the life span of the light emitting device is decreased, and reliability of the light emitting device is deteriorated.

Also, as the light is generated mainly from the active layer on the lower side of the first electrode layer, the generated light is not completely output to the external of the light emitting device but is reflected on the first electrode layer to be absorbed by the light emitting device, thereby deteriorating the optical efficiency of the light emitting device.

SUMMARY OF THE INVENTION

Embodiments provide a light emitting device having a new structure and a method for manufacturing the same.

Embodiments provide a light emitting device that can remove or reduce a current concentration phenomenon and a method for manufacturing the same.

Embodiments provide a light emitting device that can be driven at a stable operation voltage and be stably operated without the deterioration in the light intensity and a method for manufacturing the same.

Embodiments also provide a light emitting device and a method for forming the same, which address the limitations and disadvantages associated with the related art.

In an embodiment, a semiconductor light emitting device comprises: a second electrode layer comprising a projection part; a current blocking layer on the projection part of the second electrode layer; a second conductive type semiconductor layer on the second electrode layer and the current blocking layer; an active layer on the second conductive type semiconductor layer; a first conductive type semiconductor layer on the active layer; and a first electrode layer on the first conductive type semiconductor layer, at least a portion of the first electrode layer being overlapped with the current blocking layer in the vertical direction.

In an embodiment, a light emitting device comprises: a second electrode layer; current blocking layers on the central portion and the peripheral portion of the second electrode layer; a second conductive type semiconductor layer on the second electrode layer and the current blocking layers; an active layer on the second conductive type semiconductor layer; a first conductive type semiconductor layer on the active layer; and a first electrode layer on the first conductive type semiconductor layer, at least a portion of the first electrode layer being overlapped with the current blocking layers in the vertical direction.

In an embodiment, a light emitting device comprises: a second electrode layer; a current blocking layer on the second electrode layer; a second conductive type semiconductor layer on the second electrode layer and the current blocking layer; an active layer on the second conductive type semiconductor layer; a first conductive type semiconductor layer on the active layer; and a first electrode layer on the first conductive type semiconductor layer, at least a portion of the first electrode layer being overlapped with the current blocking layer in the vertical direction.

In an embodiment, the preset invention provides a light emitting device, comprising: a second electrode layer comprising at least one projection part; at least one current blocking layer on the projection part of the second electrode layer; a second conductive type semiconductor layer on the second electrode layer and the current blocking layer; an active layer on the second conductive type semiconductor layer; a first conductive type semiconductor layer on the active layer; and a first electrode layer on the first conductive type semiconductor layer, at least a portion of the first electrode layer corresponding with the current blocking layer in a vertical direction.

In an embodiment, the present invention provides a light emitting device, comprising: a second electrode layer; current blocking layers on a central portion and at least one peripheral portion of the second electrode layer; a second conductive type semiconductor layer on the second electrode layer and the current blocking layers; an active layer on the second conductive type semiconductor layer; a first conductive type semiconductor layer on the active layer; and a first electrode layer on the first conductive type semiconductor layer and corresponding with at least one of the blocking layers.

In an embodiment, the present invention provides a light emitting device, comprising: a second electrode layer; a first current blocking layer on the second electrode layer; a second conductive type semiconductor layer on the second electrode layer and the first current blocking layer; an active layer on the second conductive type semiconductor layer; a first conductive type semiconductor layer on the active layer; and a first electrode layer on the first conductive type semiconductor layer, and being above the first current blocking layer in a vertical direction.

DETAILED DESCRIPTION OF THE EMBODIMENTS

Figure 1:
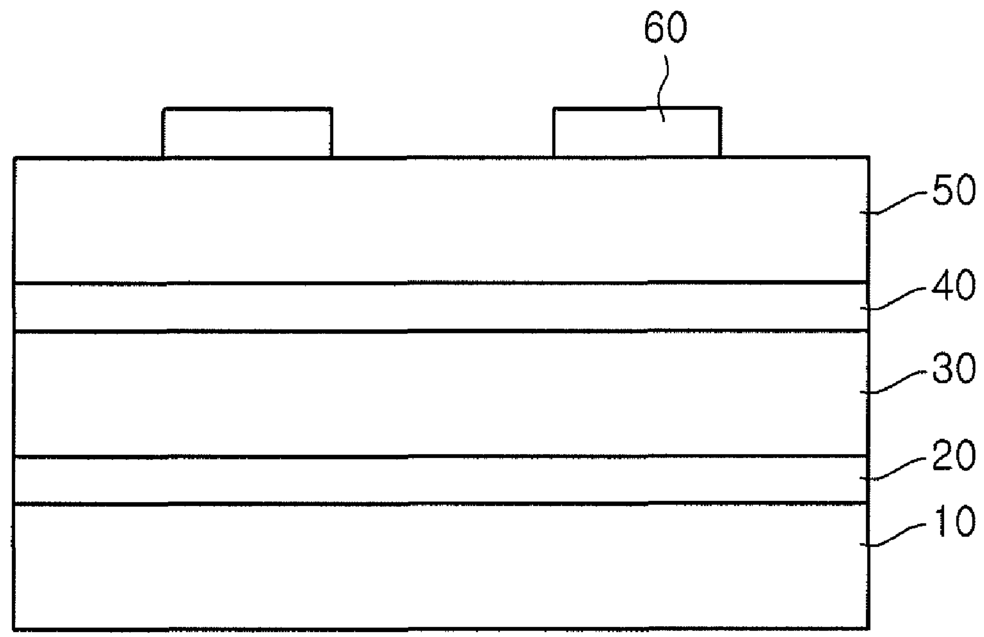
FIGS. 1 to 5 are diagrams illustrating and explaining a light emitting device according to a first embodiment of the invention, and a method for manufacturing the same.

In the description of embodiments of the invention, when a layer (e.g., film), area, pattern or structure(s) are described to be formed "on", "over", or "under" another layer (e.g., film), area, pattern or structure(s), it can be understood that the layer, area, pattern or structures are in direct contact with the another layer, area, pattern or structures or that other layer(s) (e.g., films), area(s), pattern(s) or structure(s) are additionally formed therebetween.

In the drawings, the thickness or size of each layer may have been exaggerated, omitted or schematically illustrated for the convenience and clarity of explanation. Also, the size of each constituent does not or may not necessarily reflect its actual size.

Hereinafter, a light emitting device according to embodiments of the invention and a method for manufacturing the same according to the embodiment of the invention will be described in detail with reference to the accompanying drawings.

FIGS. 1 to 5 are diagrams explaining a light emitting device according to a first embodiment, and a method for manufacturing the same.

Figure 5:
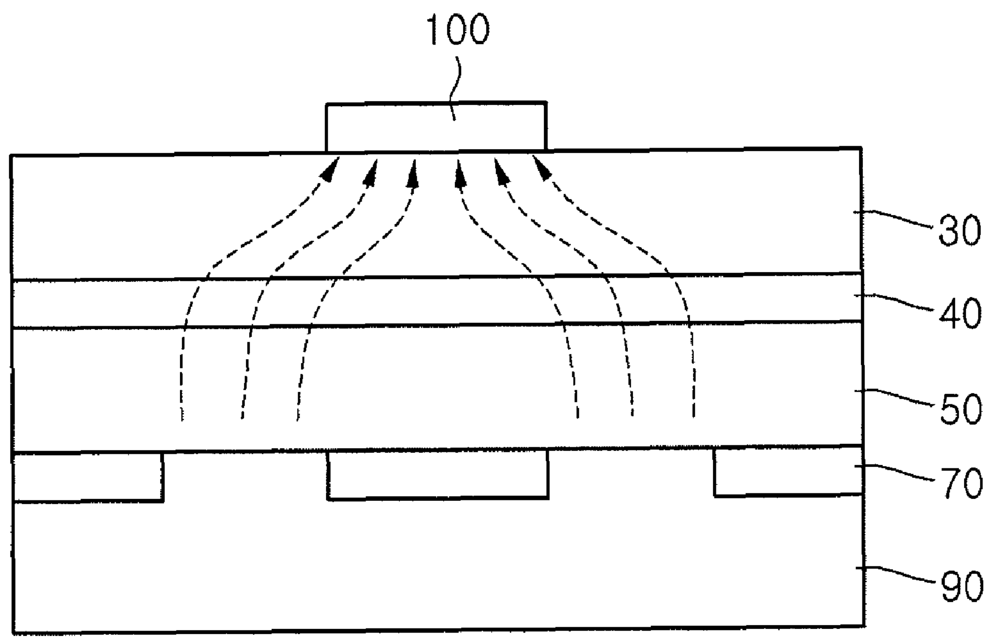

First, referring to FIG. 5, the light emitting device according to the first embodiment includes a second electrode layer 90, one or more current blocking layers 70 selectively formed on the second electrode layer 90, a second conductive type semiconductor layer 50 on the second electrode layer 90 and the current blocking layer(S) 70, an active layer 40 and a first conductive type semiconductor layer 30 formed on the active layer 40, and a first electrode layer 100 formed on the first conductive type semiconductor layer 30. All the components of the light emitting device are operatively coupled and configured.

The current blocking layer(s) 70 are formed between the second electrode layer 90 and the second conductive type semiconductor layer 50, thereby changing the path of current flowing in the light emitting device.

Each current blocking layer 70 includes a metal that forms a schottky contact with the second conductive type semiconductor layer 50. For example, each current blocking layer 70 may be formed of at least one of titanium (Ti), zirconium (Zr), chrome (Cr), gold (Au) or tungsten (W), or an alloy including at least one of titanium (Ti), zirconium (Zr), chrome (Cr), gold (Au) or tungsten (W).

At least one current blocking layer 70 may be disposed to be overlapped with the first electrode layer 100 in the vertical direction. For example, the first electrode layer 100 may be formed on a central portion of the first conductive type semiconductor layer 30, and the current blocking layer 70 may be formed under the first electrode layer 100 to correspond with the location of the first electrode layer 100, e.g., on the central portion of the second electrode layer 90. For instance, the current blocking layer 70 may align completely or substantially with the first electrode layer 100.

In addition to or in lieu of the current block layer formed to correspond with the first conductive type semiconductor layer 30, one or more current blocking layers 70 may also be formed on peripheral portion(s) of the second electrode layer 90. For instance, the current blocking layers 70 may be formed at regular intervals or non-regular intervals or as needed on the second electrode layer 90.

Meanwhile, in an area where the current blocking layer 70 is not formed, the second electrode layer 90 forms an ohmic contact with the second conductive type semiconductor layer 50.

Therefore, as shown in FIG. 5 using the dotted lines, the current flowing from the second electrode layer 90 to the first electrode layer 100 hardly flows through the area(s) having the current blocking layer(s) 70 formed therein, but flows from the second electrode layer 90 to the first electrode layer 100 in the area(S) where the current blocking layer(s) 70 are not formed. As such, the electric current flow is not concentrated on a narrow path, but is spread out in a wider path, which reduces or eliminates the current concentration phenomenon.

The second electrode layer 90 may include a conductive substrate, a reflective layer formed on the conductive substrate, and an ohmic contact layer formed on the reflective layer. Also, the second electrode layer 90 may be formed of a material that forms an ohmic contact with the second conductive type semiconductor layer 50.

For example, the conductive substrate in the second electrode layer 90 may be formed of at least one of copper (Cu), titanium (Ti), chrome (Cr), nickel (Ni), aluminum (Al), platinum (Pt), gold (Au), a semiconductor substrate implanted with impurity; the reflective layer may be formed of at least one of aluminum (Al), silver (Ag), and APC alloy (alloy including Ag, Pd, and Cu); and the ohmic contact layer may be formed of at least one of nickel (Ni), palladium (Pd), platinum (Pt), ITO, ZnO, $RuO_x$, $TiO_x$ and $IrO_x$.

The second electrode layer 90 may contact (touch directly) the lower surface and the side surface of the current blocking layer(s) 70. The upper surface of the second electrode layer 90 may be positioned on the same horizontal plane with the upper surface of the current blocking layer(s) 70.

Figure 10:
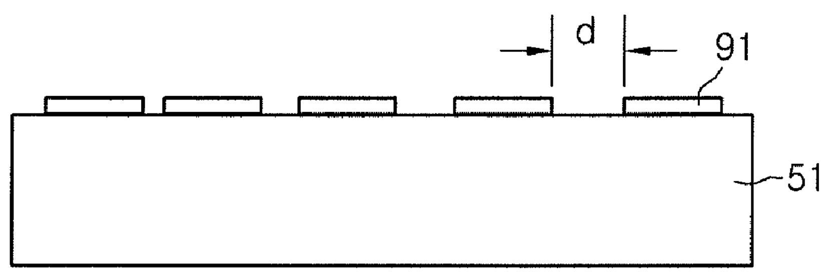
FIGS. 10 and 11 are diagrams showing experimental structures for explaining ohmic contact characteristics and schottky contact characteristics by forming a metal that forms an ohmic contact and a metal that forms a schottky contact on a second conductive type semiconductor layer, and experimental results thereof, according to an embodiment of the invention.
Figure 10:
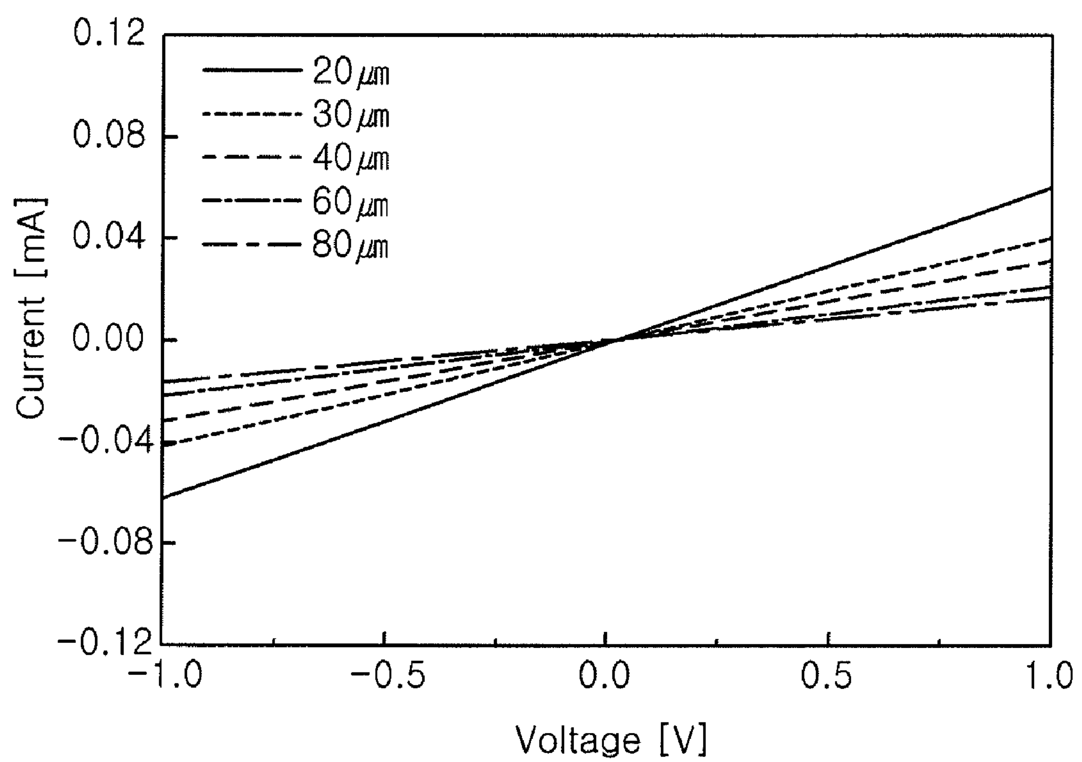
Figure 11:
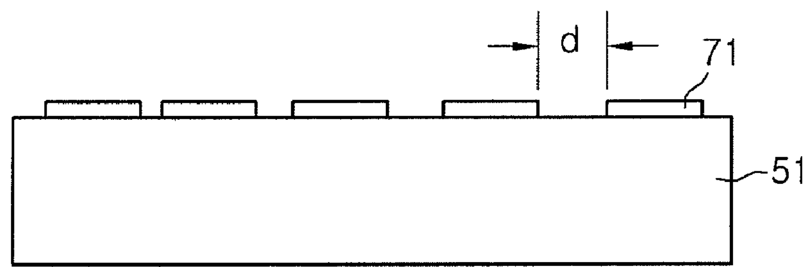
Figure 11:
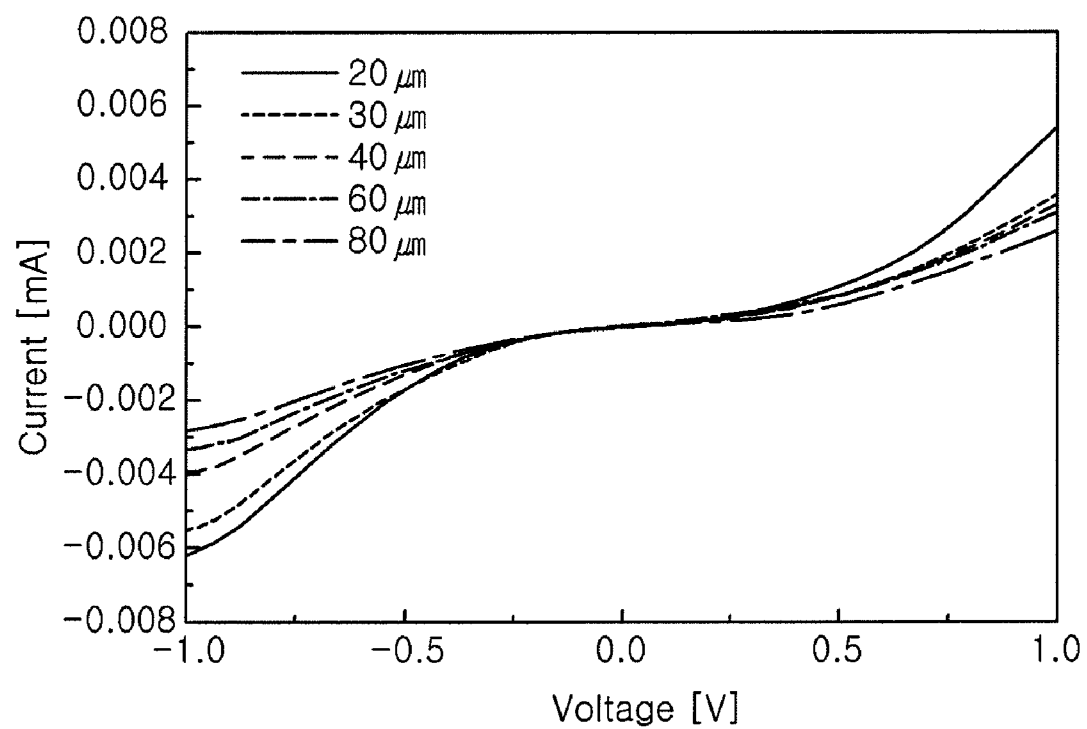

FIGS. 10 and 11 are diagrams showing experimental structures for explaining ohmic contact characteristics and schottky contact characteristics by forming a metal that forms an ohmic contact and a metal that forms a schottky contact on a second conductive type semiconductor layer, and experimental results thereof, according to an embodiment of the invention. These are non-limiting examples for explaining the invention and the advantages associated thereto.

Referring to FIGS. 10 and 11, a plurality of ohmic metal layers 91 (one example of a current blocking layer) and a plurality of schottky metal layers 71 (another example of a current blocking layer) are formed on a p-type GaN layer 51 (example of second conductive type semiconductor layer 50), respectively, where the plurality of ohmic metal layers 91 and the plurality of schottky metal layers 71 are spaced apart from each other.

First, if a positive voltage and a negative voltage are applied to two ohmic metal layers 91 of the plurality of ohmic metal layers 91, respectively, current flows from one ohmic metal layer 91 to the other ohmic metal layer 91 via the p-type GaN layer 51 in the horizontal direction.

In one experiment, the interval or space 'd' between the two ohmic metal layers 91 is adjusted to be 20 μm, 30 μm, 40 μm, 60 μm, and 80 μm. The result of this experiment shows the ohmic barrier characteristics, as shown in FIG. 10.

Next, if a positive voltage and a negative voltage are applied to two schottky metal layers 71 of the plurality of schottky metal layers 71, respectively, current flows from one schottky metal layer 71 to the other schottky metal layer 71 via the p-type GaN layer 51 in the horizontal direction.

In this experiment, the interval 'd' between the two schottky metal layers 71 is adjusted to be 20 μm, 30 μm, 40 μm, 60 μm, and 80 μm. The result of this experiment shows schottky barrier characteristics, as shown in FIG. 11.

As evidenced by the above experiments, it can be appreciated that with the light emitting device according to the first embodiment, the ohmic barrier characteristics and the schottky barrier characteristics are shown and vary according to the kind of metal (current blocking layer) contacting the second conductive type semiconductor layer 50.

Therefore, with the light emitting device according to the first embodiment, the current blocking layer 70 having the schottky barrier characteristics is formed on a position overlapped with (or substantially aligned with) the first electrode layer 100 in the vertical direction, thereby preventing the current from concentratedly flowing in the vertical direction from only a certain portion of the second electrode layer 90 to the lower side of the first electrode layer 100 and thereby allowing the current to more widely flow to the second conductive type semiconductor layer 50, the active layer 40 and the first conductive type semiconductor layer 30.

Finally, the current concentration phenomenon where the current flows concentratedly to the lower side of the first electrode layer 100 can be prevented so that the light emitting device can be driven at stable operation voltages.

Also, according to the current concentration phenomenon, when the current flows concentratedly to the lower side of the first electrode layer 100, light is mainly generated from the area of the active layer 40 positioned under the lower side of the first electrode layer 100. The light generated from the active layer 40 under the first electrode layer 100 is absorbed by the first electrode layer 100 so that the quantity of light is highly likely to be decreased or to be disappeared in the light emitting device.

In contrast, in the light emitting device according to the first embodiment of the invention, current flows from the second electrode layer 90 in the area not overlapped with the first electrode 100 in the vertical direction to the first electrode layer 100, so that more light is generated from the area(s) of the active layer 40 not overlapped with the first electrode layer 100 in the vertical direction, compared to the area of the active layer 40 overlapped with the first electrode layer 100 in the vertical direction.

And, the light generated from the area(s) of the active layer 40 not overlapped with the first electrode layer 100 in the vertical direction are hardly absorbed by the first electrode layer 100 so that the quantity of light is not likely to be decreased or to be disappeared in the light emitting device. Therefore, the light emitting device according to the embodiment has improve optical efficiency and is effective.

Meanwhile, in the light emitting device according to the first embodiment, the current blocking layers 70 are formed on the peripheral portions of the second electrode layer 90. As a result, current flowing to the peripheral portions adjacent to the side surface of the light emitting device can be reduced and accordingly, the leakage current of the light emitting device can be also reduced.

Hereinafter, a method for manufacturing the light emitting device according to the first embodiment will be described in detail with reference to the accompanying drawings.

FIGS. 1 to 5 are diagrams explaining a light emitting device according to the first embodiment, and a method for manufacturing the same.

Referring to FIG. 1, a un-doped GaN layer 20, a first conductive type semiconductor layer 30, an active layer 40, and a second conductive type semiconductor layer 50 are formed on a substrate 10. Also, a buffer layer (not shown) may further be formed between the substrate 10 and the un-doped GaN layer 20.

The substrate 10 may be formed of at least one of sapphire ($Al_2O_3$), Si, SiC, GaAs, ZnO, and MgO.

The buffer layer may be formed in a multi layer having a stacked structure such as AlInN/GaN, $In_xGa_{1-x}N$/GaN, $Al_xIn_yGa_{1-w-y}N/In_xGa_{1-x}N$/GaN, etc., and for example, it may grow by implanting trimethylgallium (TMGa), trimethylindium (TMIn), and trimethylaluminum (TMAl) into the chamber, together with hydrogen gas and ammonium gas.

The un-doped GaN layer 20 may grow by implanting trimethylgallium (TMGa) into the chamber, together with hydrogen gas and ammonium gas.

The first conductive type semiconductor layer 30 may be a nitride semiconductor layer implanted with first conductive type impurity ions, for example, a semiconductor layer implanted with n-type impurity ions. The first conductive semiconductor layer 30 may grow by implanting trimethylgallium (TMGa) and siren gas ($SiN_4$) including n-type impurity (for example, Si) into the chamber, together with hydrogen gas and ammonium gas.

And, the active layer 40 and second conductive type semiconductor layer 50 are formed on the first conductive type semiconductor layer 30.

The active layer 40 may be formed in a single-quantum well structure or in a multi-quantum well structure, for example, in a stacked structure of InGaN well layer/GaN barrier layer.

The second conductive type semiconductor layer 50 may be a nitride semiconductor layer implanted with second conductive type impurity ions, for example, a semiconductor layer implanted with p-type impurity ions. The second conductive type semiconductor layer 50 may grow by implanting trimethylgallium (TMGa) and bisethylcyclopentadienyl magnesium ($EtCp_2Mg$) $\{Mg(C_2H_5C_5H_4)_2\}$ into the chamber, together with hydrogen gas and ammonium gas.

And, mask layers 60 are formed on the second conductive type semiconductor layer 50. The mask layers 60 are used for selectively forming the current blocking layers 70 on the second conductive type semiconductor layer 50.

Figure 2:
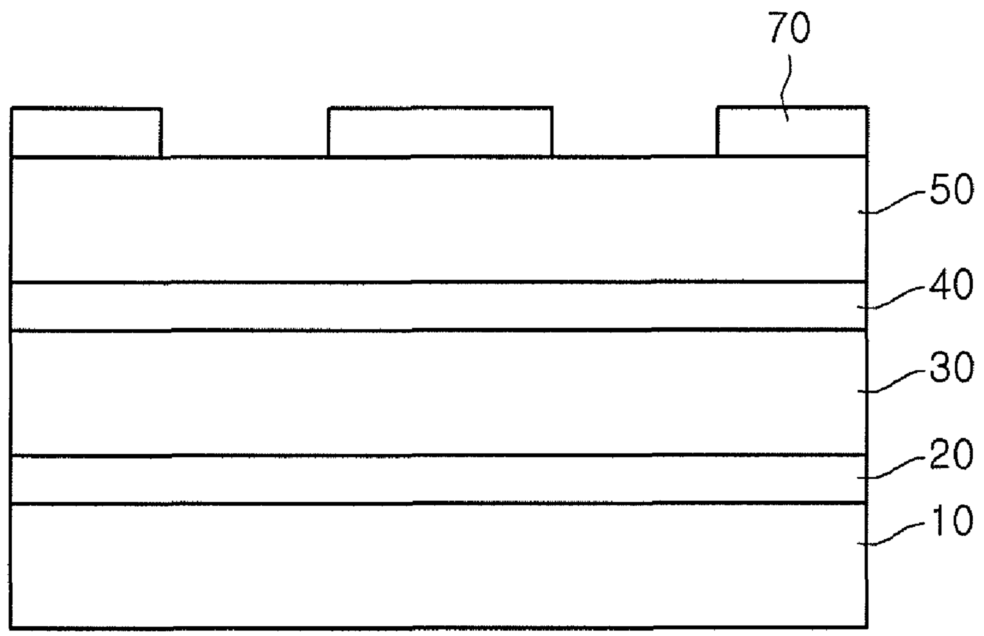

Referring to FIG. 2, if a metal that forms a schottky contact is deposited on the second conductive type semiconductor layer 50 on which the mask layers 60 are formed and then the mask layers 60 are removed, current blocking layers 70 are selectively formed on the second conductive type semiconductor layer 50.

For example, the metal that forms a schottky contact may use at least one of titanium (Ti), zirconium (Zr), chrome (Cr), gold (Au) or tungsten (W).

Figure 3:
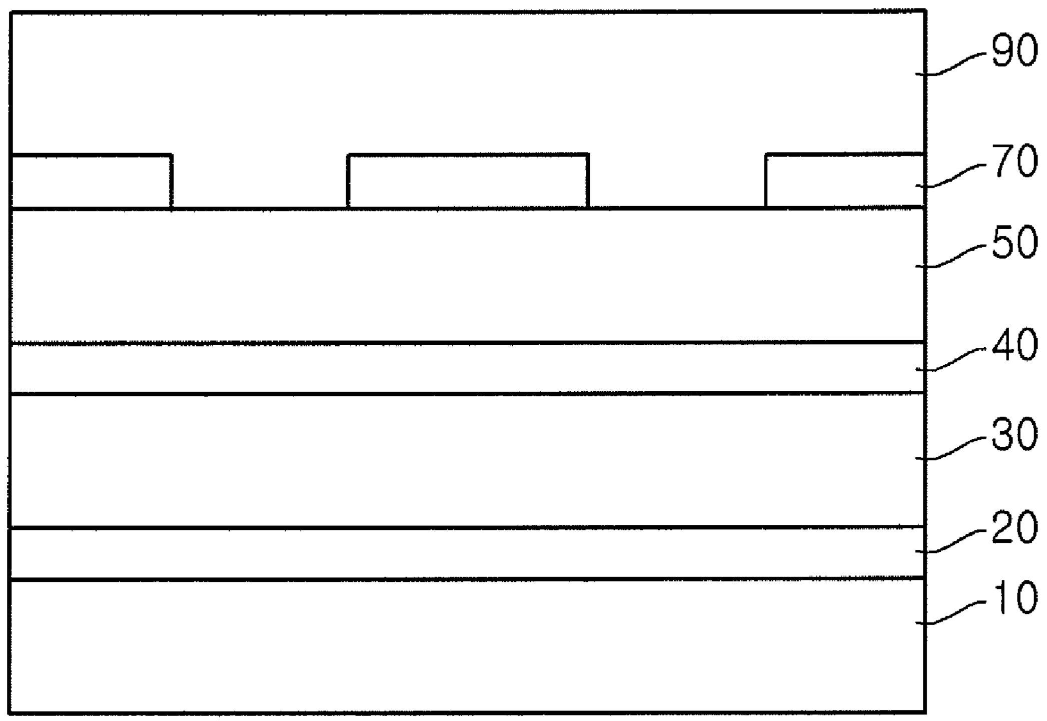

Referring to FIG. 3, after forming the current blocking layers 70, the second electrode layer 90 is formed on the second conductive type semiconductor layer 50 and the current blocking layers 70.

The second electrode layer 90 may include an ohmic contact layer, a reflective layer, and a conductive substrate. The ohmic contact layer may be formed on the second conductive type semiconductor layer 50 and the current blocking layers 70, and the reflective electrode layer and the conductive substrate may be formed on the ohmic contact layer. Alternatively, the conductive substrate or the reflective layer having the ohmic contact characteristics may be formed directly on the second conductive type semiconductor layer 50.

Figure 4:
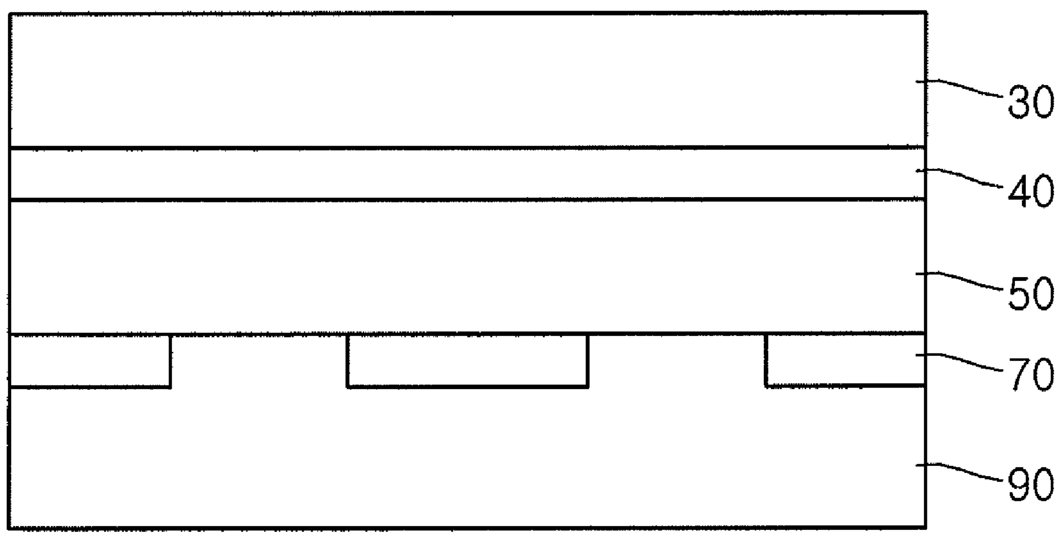

Referring to FIG. 4, after forming the second electrode layer 90, the substrate 10 and the un-doped GaN layer 20 are removed. When a buffer layer is formed, the buffer layer is also removed.

Referring to FIG. 5, the first electrode layer 100 is formed on the first conductive type semiconductor layer 30.

The first electrode layer 100 may be formed of at least one of copper (Cu), titanium (Ti), chrome (Cr), nickel (Ni), aluminum (Al), platinum (Pt), or gold (Au).

Accordingly, through the methods as described above, the light emitting device according to the first embodiment can be manufactured.

Figure 6A:
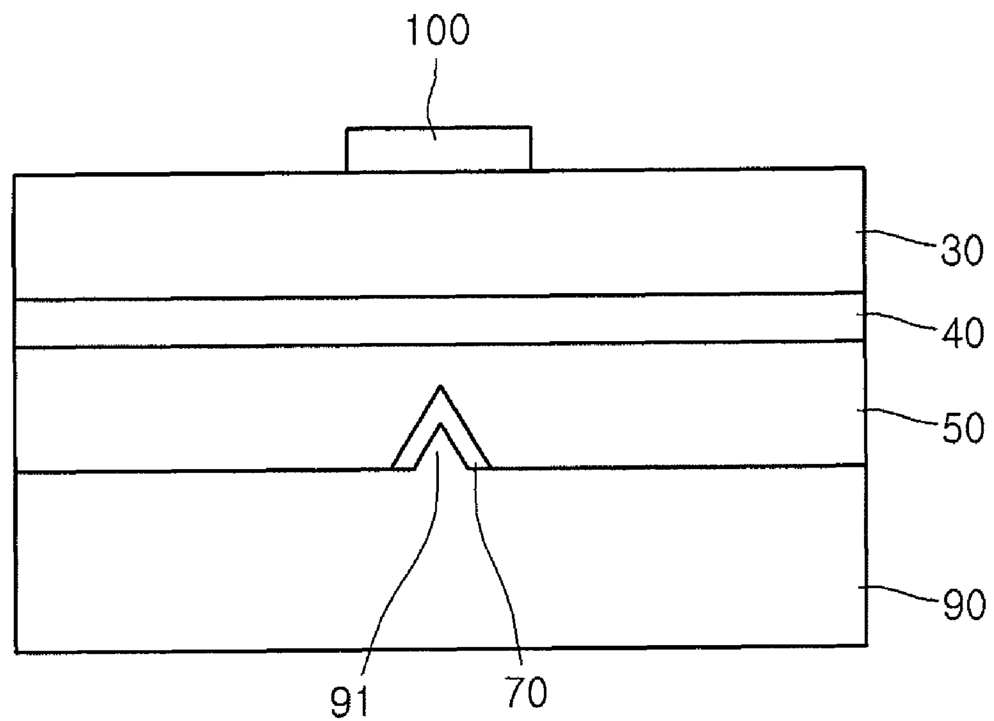
FIG. 6A is a diagram illustrating and explaining a light emitting device according to a second embodiment of the invention.

FIG. 6A is a diagram explaining a light emitting device according to a second embodiment.

When explaining the light emitting device according to the second embodiment, the description overlapped with the light emitting device according to the first embodiment will be omitted.

Referring to FIG. 6A, the light emitting device according to the second embodiment includes a second electrode layer 90 that includes a projection part 91, a current blocking layer 70 formed on the projection part 91, a second conductive type semiconductor layer 50 formed on the second electrode layer 90 and the current blocking layer 70, an active layer 40 formed on the second conductive type semiconductor layer 50, a first conductive type semiconductor layer 30 formed on the active layer 40, and a first electrode layer 100 formed on the first conductive type semiconductor layer 30.

The current blocking layer 70 is formed between the second electrode layer 90 and the second conductive semiconductor layer 50, thereby changing the path of current flowing in the light emitting device.

The current blocking layer 70 includes a metal that forms a schottky contact with the second conductive type semiconductor layer 50. For example, the current blocking layer 70 may be formed of at least one of titanium (Ti), zirconium (Zr), chrome (Cr), gold (Au) or tungsten (W), or an alloy including at least one of titanium (Ti), zirconium (Zr), chrome (Cr), gold (Au) or tungsten (W).

At least a portion of the projection part 91 may be disposed to be overlapped with (or correspond with) the first electrode layer 100 in the vertical direction, and accordingly, at least a portion of the current blocking layer 70 may be disposed on the projection part 91 to overlap with or correspond with the first electrode layer 100 in the vertical direction. For example, the first electrode layer 100 may be formed on a central portion of the first conductive type semiconductor layer 30, and the current blocking layer 70 may be formed under the first electrode layer 100, e.g., on the central portion of the second electrode layer 90.

At least a portion of the current blocking layer 70 is disposed on the same horizontal plane with the second conductive type semiconductor layer 50, and at least a portion of the second electrode layer 90 is disposed on the same horizontal plane with the second conductive type semiconductor layer 50. Also, at least portions of the current blocking layer 70, the second electrode layer 90, and the second conductive type semiconductor layer 50 may be disposed on the same horizontal plane.

In the light emitting device according to the second embodiment, the current blocking layer 70 serves to change the flow of current as in the light emitting device according to the first embodiment.

Also, since the current blocking layer 70 is formed on the projection part 91, the light emitted from the active layer is scattered by the current blocking layer 70, making it possible to improve the light extraction efficiency of the light emitting device.

In the light emitting device according to the second embodiment, the current blocking layer 70 may be formed by forming a groove (or indentation) by selectively etching the second conductive type semiconductor layer 50 and then burying a material having schottky contact characteristics with the second conductive type semiconductor layer 50 in the groove. And then, a second electrode layer 90 is formed on the current blocking layer 70 and the second conductive type semiconductor layer 50, thereby making it possible to form the light emitting device having the structure as shown in FIG. 6. The shape and size of the projection part 91 and the current blocking layer 70 may vary and the present invention encompasses such variations. For instance, the current blocking layer 70 may be in the shape of a "U" or "V" or a mere indentation.

Figure 6B:
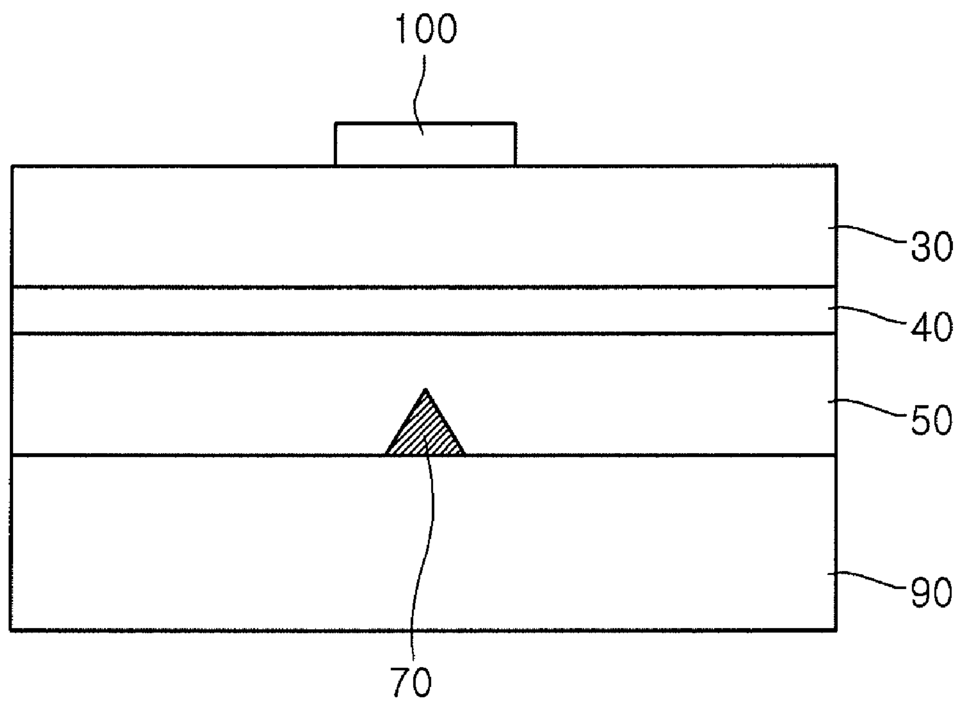
FIG. 6B is a diagram illustrating a variation of the light emitting device of FIG. 6B.

FIG. 6B illustrates a variation of the light emitting device of FIG. 6A according to the second embodiment. As shown in FIG. 6B, instead of being formed on the projection part 91, the current blocking layer 70 of FIG. 6B is formed directly on the flat part or coplanar surface of the second electrode 90, and can have a substantially triangular shape. For instance, the current blocking layer 70 of FIG. 6B can have a triangular/pyramid shape or an upside-down triangular/pyramid shape or some other shape.

Figure 7:
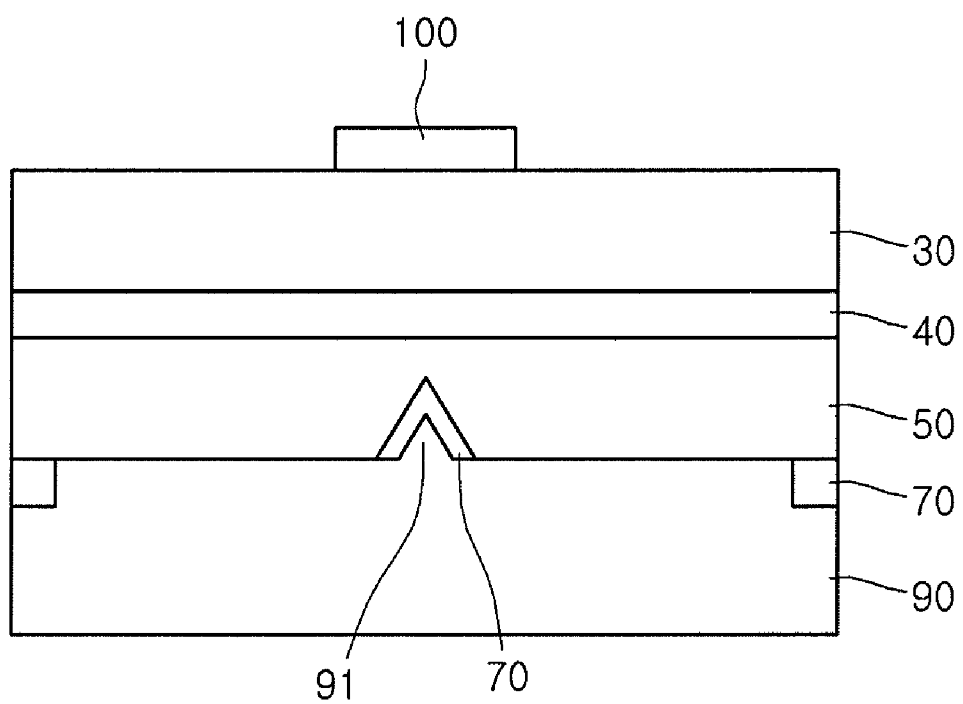
FIG. 7 is a diagram illustrating and explaining a light emitting device according to a third embodiment of the invention.

FIG. 7 is a diagram explaining a light emitting device according to a third embodiment.

When explaining the light emitting device according to the third embodiment, the description overlapped with the light emitting device according to the first embodiment and the second embodiment will be omitted.

Referring to FIG. 7, the light emitting device according to the third embodiment has current blocking layers that are a combination of the current blocking layers of the first and second embodiments.

The current blocking layers 70 are formed on a central portion and peripheral portion(s) of the second electrode layer 90. Similarly, a projection part 91 is formed on the central portion of the second electrode layer 90 to be overlapped with (or correspond with) the first electrode layer 100 in the vertical direction, and the current blocking layer 70 is formed on the projection part 91.

The current blocking layer 70 formed on the central portion of the second electrode layer 90 is formed in the similar shape as the current blocking layer 70 of the light emitting device according to the second embodiment, and the current blocking layer(s) 70 formed on the peripheral portion(s) of the second electrode layer 90 are formed in the similar shape as the current blocking layers 70 according to the first embodiment.

Figure 8A:
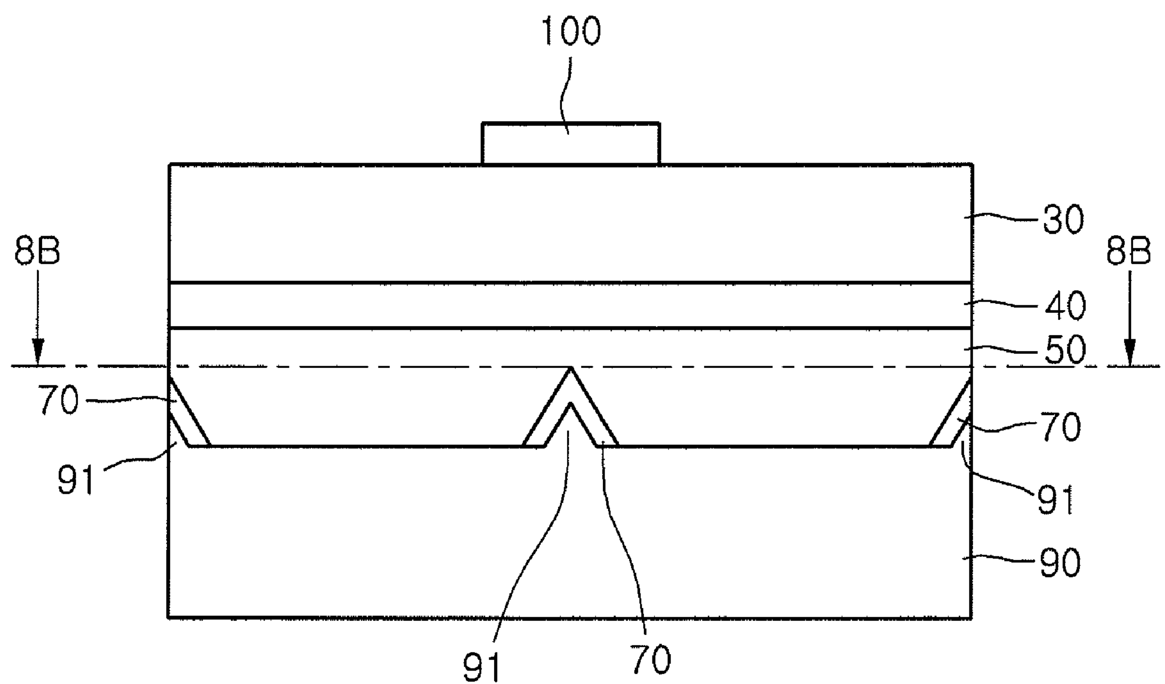
FIG. 8A is a diagram illustrating and explaining a light emitting device according to a fourth embodiment of the invention.
Figure 8B:
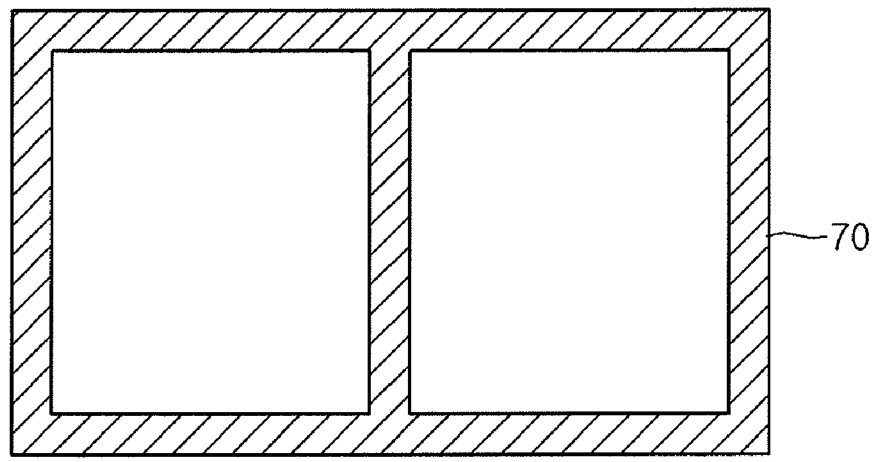
FIG. 8B is a top plan view of the light emitting device of FIG. 8A cut along a dotted line 8B-8B in FIG. 8A.

FIG. 8A is a diagram explaining a light emitting device according to a fourth embodiment, and FIG. 8B is a top plan view of the light emitting device of FIG. 8A cut along a dotted line 8B-8B in FIG. 8A as a variation.

When explaining the light emitting device according to the fourth embodiment, the description overlapped with the light emitting device according to the first embodiment to the third embodiment will be omitted.

Referring to FIG. 8A, the light emitting device according to the fourth embodiment has the shape similar with the light emitting device according to the second embodiment.

The current blocking layers 70 are formed on a central portion and peripheral portion(s) of the second electrode 90. A projection part 91 is formed on the central portion of the second electrode layer 90 to be overlapped with or correspond with the first electrode layer 100 in the vertical direction, and the current blocking layer 70 is formed on the projection part 91.

Also, additional projection part(s) 91 are formed on the peripheral portion(s) on the second electrode layer 90, and additional current blocking layer(s) 70 are formed on the projection part(s) 91 to correspond with the additional projection part(s) 91. As such, a window pattern or the like as shown in the top plan view of the current blocking layer(s) 70 in FIG. 8B may be formed by the current blocking layer(s) 70. As further variations, the current blocking layer(s) 70 may be formed to surround only a part of the periphery of the second electrode 90, and thus may not completely surround it. All the current blocking layers 70 can have the same or similar shape and/or size to each other, or may have varying shapes and/or sizes.

In all the embodiments of the invention, the current blocking layer can be formed with a non-metal or non-conductive material, e.g., $SiO_2$ or similar compound or material, other insulating material, ITO, ZnO, or IrO, etc.

Figure 9:
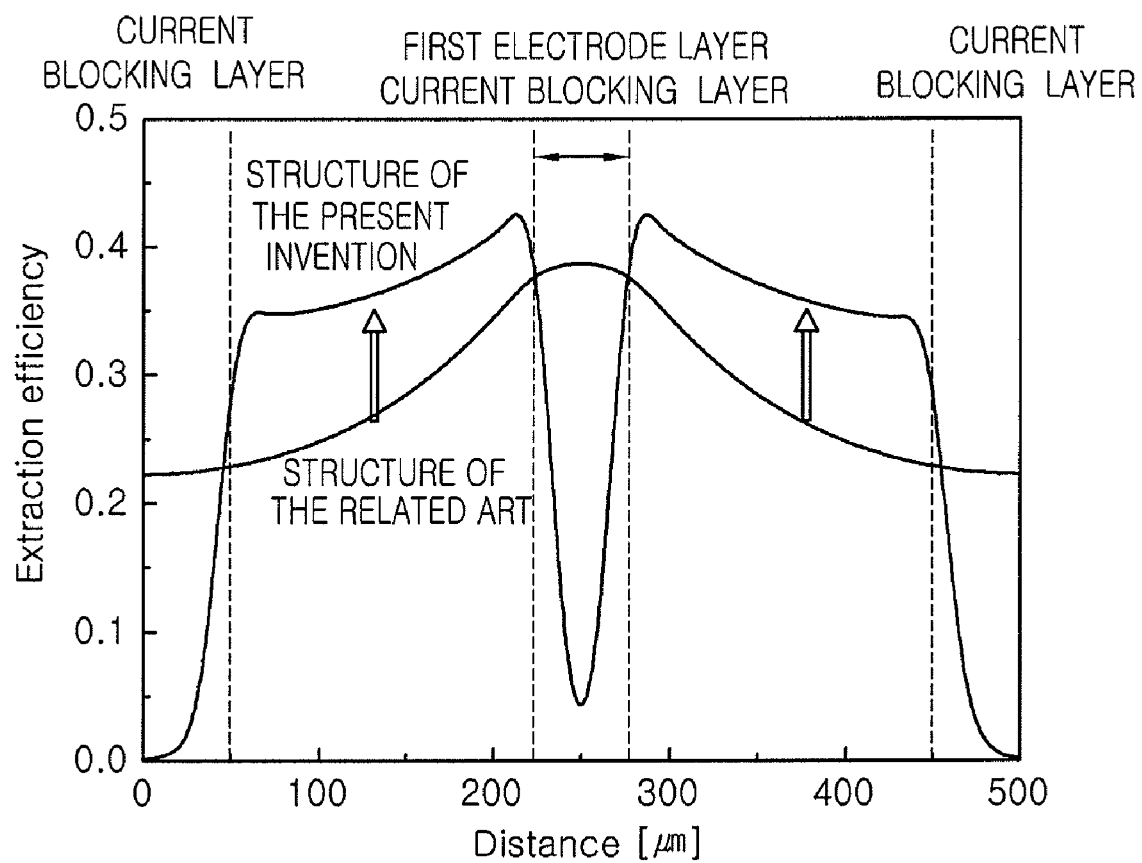
FIG. 9 is a diagram illustrating and explaining light extraction characteristics of a light emitting device according to embodiments of the invention.

FIG. 9 is a diagram explaining light extraction characteristics of a light emitting device according to embodiments.

Referring to FIG. 9, X axis represents distance from a left-sided end of the light emitting device to a right-sided end thereof in the cross-sectional view of FIG. 5, wherein the current blocking layers 70 are disposed on portions corresponding to 0 to 50 μm, 225 to 275 μm, and 450 to 550 μm. Y axis represents values that relatively represent the quantity of light extracted from the light emitting device on the assumption that the quantity of light generated from the light emitting device is 1.

In FIG. 9, the structure of the light emitting device in the related art means a structure where the current blocking layers 70 does not exist and are not formed between the second conductive type semiconductor layer 50 and the second electrode layer 90. In the structure of the related art, more current flows towards the central portion so that the greatest quantity of light is generated and extracted from the area of the active layer 40 overlapped with the first electrode layer 100 in the vertical direction.

In contrast, in the structure of the present invention, current flows mainly through between the current blocking layer and the current blocking layer 70 so that the greatest quantity of light is generated and extracted from the active layer 40 on the position corresponding to the area(s) where the current blocking layers 70 are not formed.

In the related art, the light generated from the area of the active layer 40 overlapped with the first electrode layer 100 in the vertical direction is absorbed by the first electrode layer 100 so that the quantity of light is highly likely to be decreased or to be disappeared in the light emitting device.

Meanwhile, in the present embodiment, as shown in FIG. 9, since a great quantity of light is generated from the area of the active layer 40 not overlapped with the first electrode layer 100 in the vertical direction, the light is reflected on the first electrode layer 100, making it possible to prevent or reduce the light disappearing in the light emitting device.

Any reference in this specification to "one embodiment," an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:

a second electrode layer comprising at least one projection part;

a current blocking layer on the projection part of the second electrode layer;

a second conductive type semiconductor layer on the second electrode layer and the current blocking layer;

an active layer on the second conductive type semiconductor layer;

a first conductive type semiconductor layer on the active layer; and a first electrode layer on the first conductive type semiconductor layer, at least a portion of the first electrode layer corresponding with the current blocking layer in a vertical direction.

2. The light emitting device according to claim 1, wherein the current blocking layer extends along a central portion of the second electrode layer and/or surrounds at least a portion of a periphery of the second electrode layer.

3. The light emitting device according to claim 1, wherein the projection part is disposed at a central portion of the second electrode layer and/or a peripheral portion of the second electrode layer.

4. The light emitting device according to claim 1, wherein the current blocking layer is formed of at least one of titanium (Ti), zirconium (Zr), chrome (Cr), gold (Au) or tungsten (W), or an alloy comprising at least one of titanium (Ti), zirconium (Zr), chrome (Cr), gold (Au) or tungsten (W).

5. The light emitting device according to claim 1, wherein the current blocking layer includes a first current blocking layer disposed on the projection part of the second electrode layer, and a second current blocking layer disposed at an indented area of the second electrode layer.

6. The light emitting device according to claim 5, wherein the first current blocking layer is disposed at a central portion of the second electrode layer, and the second current blocking layer is disposed at a peripheral portion of the second electrode layer.

7. The light emitting device according to claim 1, wherein the projection part includes a plurality of projection parts, and the current blocking layer includes a plurality of current blocking layers spaced apart from each other and disposed respectively on the plurality of projection parts.

8. The light emitting device according to claim 7, wherein the plurality of current block layers are disposed at a central portion of the second electrode layer and at least one peripheral portion of the second electrode layer.

9. The light emitting device according to claim 1, wherein the current blocking layer forms a schottky contact with the second conductive type semiconductor layer, and the second electrode layer forms an ohmic contact with the second conductive type semiconductor layer.

10. The light emitting device according to claim 1, wherein the current blocking layer is disposed on a curved surface or slanted surfaces of the projection part.

11. A light emitting device, comprising:

a second electrode layer;

a current blocking layer the second electrode layer;

a second conductive type semiconductor layer on the second electrode layer and the current blocking layer;

an active layer on the second conductive type semiconductor layer;

a first conductive type semiconductor layer on the active layer; and a first electrode layer on the first conductive type semiconductor layer, wherein the current blocking layer is disposed on the second electrode layer and has a substantially triangular shape.

12. The light emitting device according to claim 11, wherein the current blocking layer is disposed on a central portion of the second electrode layer and at least one peripheral portion of the second electrode layer.

13. The light emitting device according to claim 11, wherein the current block layer is overlapped with the first electrode layer in a vertical direction.

14. The light emitting device according to claim 11, wherein the current blocking layer forms a schottky contact with the second conductive type semiconductor layer and the second electrode layer forms an ohmic contact with the second conductive type semiconductor layer.

15. A light emitting device, comprising:

a second electrode layer comprising a projection part;

a first current blocking layer on the second electrode layer;

a second conductive type semiconductor layer on the second electrode layer and the first current blocking layer;

an active layer on the second conductive type semiconductor layer;

a first conductive type semiconductor layer on the active layer; and a first electrode layer on the first conductive type semiconductor layer, wherein the first current blocking layer is disposed on the projection part of the second electrode layer.

16. The light emitting device according to claim 15, wherein the first current blocking layer is disposed directly on the second electrode layer and has a shape substantially corresponding with the projection part.

17. The light emitting device according to claim 15, wherein the first current blocking layer is aligned with the first electrode layer.

18. The light emitting device according to claim 15, wherein the first current blocking layer is overlapped with the first electrode layer in a vertical direction and the first conductive semiconductor layer includes an n-type impurity.

19. The light emitting device according to claim 18, further comprising:

a second current blocking layer spaced apart from the first current blocking layer, and formed on another projected part of the second electrode layer or in an indented area of the second electrode layer.

20. The light emitting device according to claim 19, wherein at least one of the first and second current blocking layers forms a schottky contact with the second conductive type semiconductor layer.

21. The light emitting device according to claim 20, wherein at least one of the first and second current blocking layers is formed of at least one of titanium (Ti), zirconium (Zr), chrome (Cr), gold (Au) or tungsten (W), or an alloy comprising at least one of titanium (Ti), zirconium (Zr), chrome (Cr), gold (Au) or tungsten (W).

* * * * *